United States Patent
Szelong et al.

(10) Patent No.: US 11,257,814 B2
(45) Date of Patent: Feb. 22, 2022

(54) TRACKING TEMPERATURE COMPENSATION OF AN X/Y STRESS INDEPENDENT RESISTOR

(71) Applicant: TEXAS INSTRUMENTS INCORPORATED, Dallas, TX (US)

(72) Inventors: Michael Szelong, Freising (DE); James Robert Todd, Plano, TX (US); Tobias Bernhard Fritz, Mainburg (DE); Ralf Peter Brederlow, Poing (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 315 days.

(21) Appl. No.: 16/428,682

(22) Filed: May 31, 2019

(65) Prior Publication Data

US 2020/0227408 A1 Jul. 16, 2020

Related U.S. Application Data

(60) Provisional application No. 62/792,055, filed on Jan. 14, 2019.

(51) Int. Cl.
*H01L 27/08* (2006.01)
*G01L 1/18* (2006.01)
*H01L 49/02* (2006.01)

(52) U.S. Cl.
CPC ............ *H01L 27/0802* (2013.01); *G01L 1/18* (2013.01); *H01L 28/20* (2013.01)

(58) Field of Classification Search
CPC ........ H01L 27/20; H01L 27/0802; G01L 1/18
See application file for complete search history.

(56) References Cited

U.S. PATENT DOCUMENTS

| | | | |
|---|---|---|---|
| 8,240,218 B2* | 8/2012 | Ausserlechner | G01L 1/18 73/777 |
| 10,352,792 B2 | 7/2019 | Nurmetov et al. | |
| 2013/0069198 A1* | 3/2013 | Claeys | H01L 29/945 257/532 |
| 2015/0002145 A1* | 1/2015 | Ausserlechner | G01R 33/07 324/251 |
| 2017/0054012 A1* | 2/2017 | Hutzler | H01L 29/7396 |
| 2019/0229180 A1* | 7/2019 | Lin | H01L 21/02573 |
| 2020/0203536 A1* | 6/2020 | Karino | H02M 7/493 |

* cited by examiner

*Primary Examiner* — Kyung S Lee
(74) *Attorney, Agent, or Firm* — Michael A. Davis, Jr.; Charles A. Brill; Frank D. Cimino

(57) ABSTRACT

An integrated circuit comprises a semiconductor substrate having a surface. A lateral resistor is arranged in a first plane parallel to the surface of the substrate. A vertical reference resistor comprises a layer arranged in a second plane parallel to the surface of the substrate and deeper than the first plane. This layer is doped to promote current flow in the second plane. The vertical reference resistor further comprises a first trench and a second trench coupled between the layer and the surface of the substrate. The first and second trenches are arranged in a vertical direction orthogonal to the first and the second planes and are doped to impede current flow in the vertical direction. A cross-section of the first and second trenches is two-fold rotationally symmetric around the vertical direction, and the lateral resistor and the first and second trenches have the same temperature coefficient.

16 Claims, 5 Drawing Sheets

TRACKING TEMPERATURE COMPENSATION OF AN X/Y STRESS INDEPENDENT RESISTOR

CROSS-REFERENCE TO RELATED APPLICATIONS

This application claims priority to U.S. Provisional Application No. 62/792,055, filed Jan. 14, 2019, which is hereby incorporated by reference.

BACKGROUND

Mechanical stress and temperature can cause changes to a semiconductor die, for example by changing the dimensions or mobility of devices on the die. Such changes can cause modifications to circuit parameters associated with the devices, such as the frequency of an integrated oscillator and resistivity of resistors, which in turn changes the behavior of the integrated circuits (ICs) including the devices. Some circuit parameters like bandgap voltage and oscillator frequency respond differently to stress in the x direction than stress in the y direction. Determining the magnitude and direction of stress components allows proper compensation for mechanical stresses on the chip, chip temperature, and the resulting influence on devices on the chip. Some stress sensing circuits include resistors in the x and y directions to determine stress components in each direction. The resistance from the sensing resistors is compared to the resistance from a reference resistor in the z direction. However, in some examples the reference resistor has a different temperature coefficient than the sensing resistors, which can cause improper adjustments due to confusion between temperature and stress effects. Further, in some examples the resistance of the reference resistor is influenced by in-plane stresses as well, masking the correct magnitude of stress components.

SUMMARY

In some implementations, an integrated circuit comprises a semiconductor substrate having a surface and a vertical reference resistor. The vertical reference resistor comprises a layer arranged in a plane parallel to the surface of the substrate. The layer is doped to promote current flow in the plane. The vertical reference resistor further comprises a first trench and a second trench coupled between the layer and the surface of the substrate. The first and second trenches are arranged in a vertical direction orthogonal to the plane and the surface, and are doped to impede current flow in the vertical direction. A cross-section of the first and second trenches is two-fold rotationally symmetric around the vertical direction.

In some examples, the integrated circuit also includes a lateral resistor arranged on a second plane parallel to the surface of the substrate. The second plane is shallower than the plane in which the vertical reference resistor's layer is arranged. The lateral resistor and the first and second trenches have the same temperature coefficients. In some examples, the lateral resistor and the first and second trenches have the same doping.

In some examples, the first and second trenches are separated by an isolating structure. In some examples, a cross-section of the second trench is pin-hole shaped. The integrated circuit can be used as a stress sensing circuit. In these examples, the integrated circuit includes the lateral resistor, a first current source coupled to the lateral resistor, a second current source coupled to the vertical reference resistor, and an amplifier coupled to the lateral resistor and the vertical reference resistor. The amplifier is configured to output a voltage difference signal between a voltage on the lateral resistor and a voltage on the vertical reference resistor. The voltage difference signal indicates a magnitude and direction of an in-plane stress on the integrated circuit.

DETAILED DESCRIPTION

Some stress sensing circuits include resistors arranged in a lateral plane parallel to a surface of the semiconductor die including the stress sensing circuits. The resistors in the lateral plane are arranged perpendicular to one another and are used to determine stress components in the respective directions within the lateral plane. The resistances from the sensing resistors are compared to the resistance from a reference resistor in a vertical direction perpendicular to the lateral plane. However, some stress sensing circuits include reference resistors having a different temperature coefficient than the sensing resistors, which can cause improper adjustments due to confusion between temperature and stress effects. Further, in some examples the reference resistor is influenced by in-plane stresses as well, masking the correct magnitude of stress components.

The disclosed reference resistor for use in stress sensing circuits has the same temperature dependency as the associated sensing resistor because the two resistors have substantially the same dopings. This ensures the sensing and reference resistors have the same temperature coefficient and respond to temperature changes in substantially the same way, preventing confusion of different temperature responses for actual stress on the sensing resistor. The disclosed reference resistor is also symmetric in the x and y directions, ensuring the resistance of the reference resistor is largely independent of the direction of in-plane stresses.

An example reference resistor includes a buried layer that is highly doped to promote current flow and exhibit low resistance. The buried layer is arranged in a lateral plane parallel to the surface of a semiconductor die including the example reference resistor. The example reference resistor also includes deep vertical paths arranged perpendicular to the lateral plane including the buried layer. The deep vertical paths are side wall doped to exhibit high resistance in the vertical direction, perpendicular to the buried layer, with substantially the same temperature coefficient as an associated sensing resistor. The depth and the doping of the vertical paths and the doping and thickness of the buried layer cause the example reference resistor to experience substantially all vertical current flow. A cross-section of the deep vertical paths is two-fold rotationally symmetric, such as a pinhole or a toroid inside a larger toroid. The vertical current flow and symmetric layout of the deep vertical paths in the x and y directions reduce stress direction dependencies of the example reference resistor.

Figure 1:
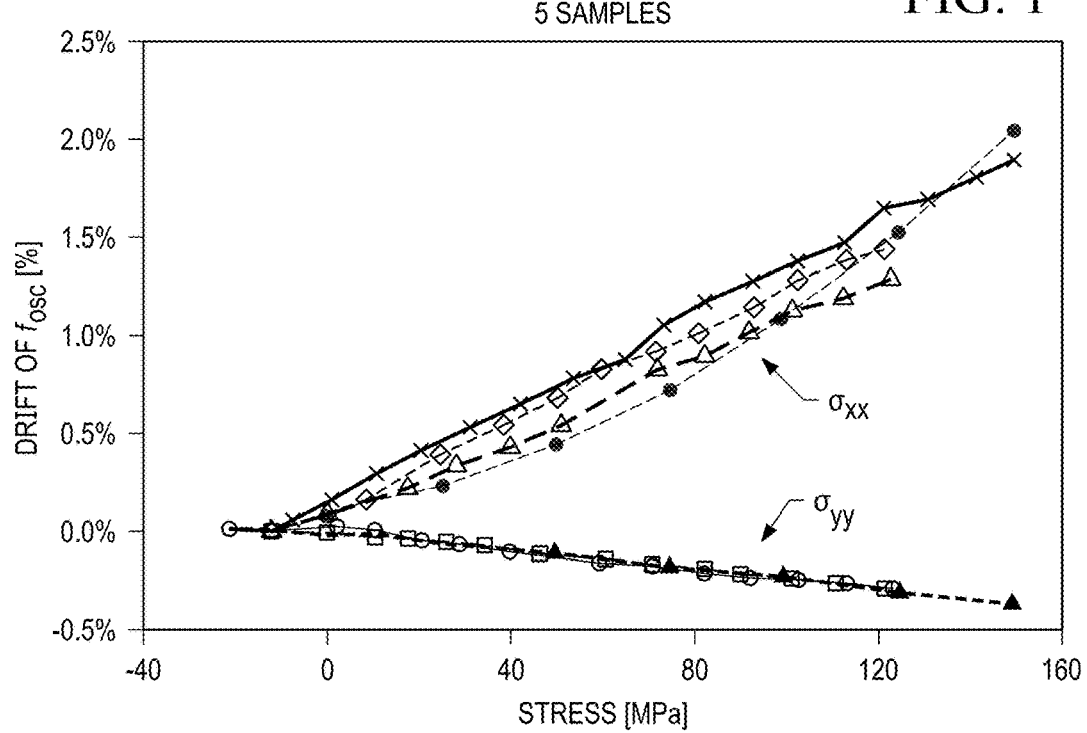
FIG. 1 shows a graph demonstrating how an oscillator responds differently to stress in two orthogonal directions.

FIG. 1 shows a graph demonstrating how an oscillator responds differently to stress in two orthogonal directions. The graph shown in FIG. 1 is from the reference, "Electrical Compensation of Mechanical Stress Drift in Precision Analog Circuit", M. Motz, U. Ausserlechner, Springer, 2016, and demonstrates the percentage drift in output frequency of a resistor/capacitor (RC) relaxation oscillator as stress is applied to the integrated circuit (IC) on which the oscillator is implemented. The oscillator responds differently to stress in one direction than in another, experiencing different percentage drift in output frequency depending on the direction of stress applied to it. In this example, stress along the x-axis, σxx, causes a much larger shift in the oscillator's output frequency than stress along the y-axis, σyy. Further, stress along the x-axis causes an increase in output frequency, while stress along the y-axis causes a decrease in output frequency.

Figure 2:
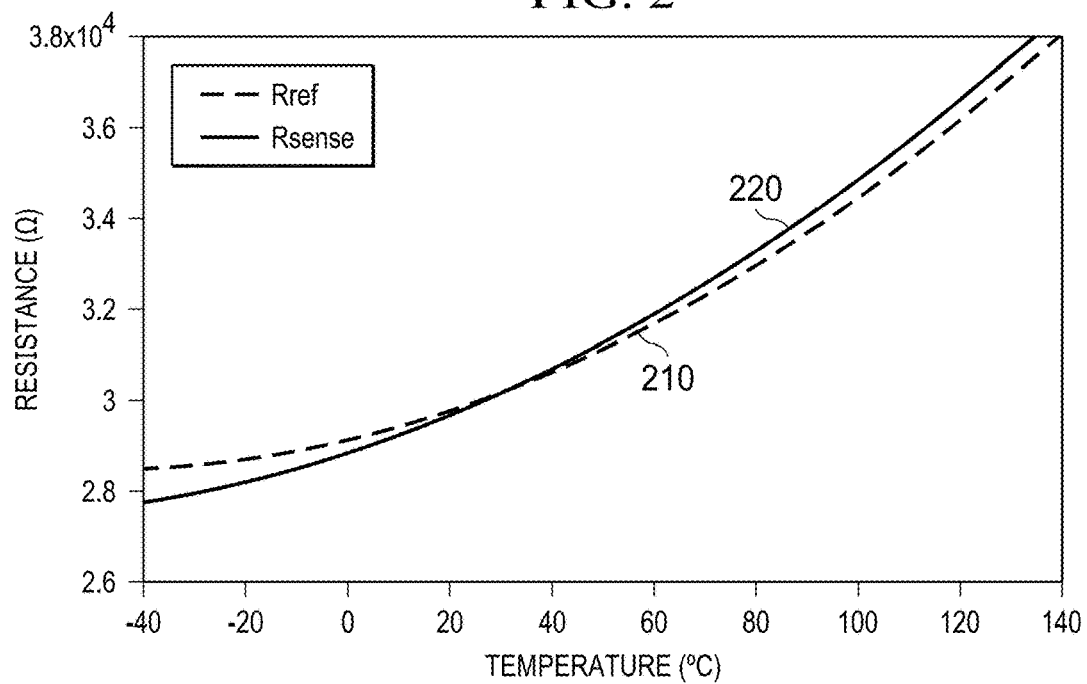
FIG. 2 shows a graph demonstrating the effect of temperature on an example reference resistor and an example sensing resistor.

Temperature can also affect components of an IC. FIG. 2 shows a graph demonstrating the effect of temperature on an example reference resistor 210 and an example sensing resistor 220 with different dopings. The different doping between the reference resistor 210 and the sensing resistor 220 causes the two resistors to have different temperature dependencies. If the reference resistor 210 and the sensing resistor 220 are used in a stress sensing circuit, ambiguity will arise from the different temperature dependencies. At high or low temperatures, the reference and sensing resistors 210 and 220 will behave differently without any stress applied, yet the stress sensing circuit will identify the difference between the reference and sensing resistors 210 and 220 and treat it as a stress applied to the IC. The mistakenly identified stress will prompt unnecessary and inaccurate adjustments in other circuits on the IC.

Figure 3:
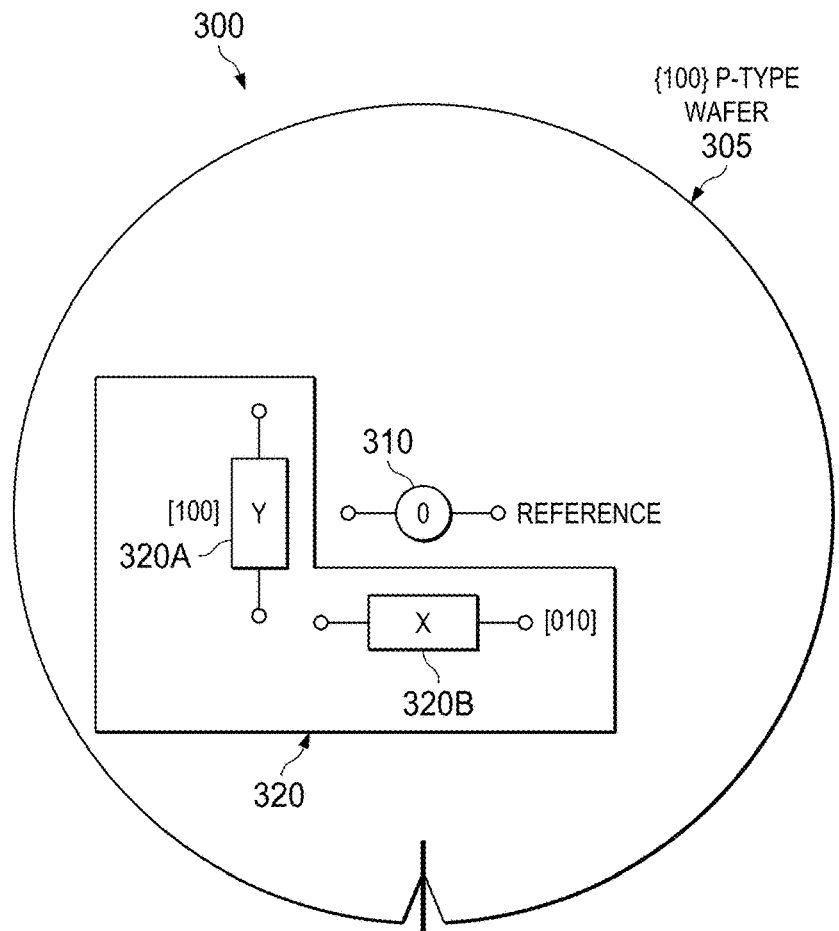
FIG. 3 illustrates an example stress sensing element.

FIG. 3 illustrates an example stress sensing element 300. A semiconductor wafer 305, e.g., a silicon wafer, is sawn from a single crystal rod such that the wafer surface is associated to a crystallographic plane. Miller indices, indicated by curly brackets { }, are used to determine the respective plane in a cubic crystal. FIG. 3 depicts a top view of stress sensing element 300 on a p-type semiconductor substrate 305 that is cut in the {100} plane and provided with a notch along the [100] direction. Although not a limitation, the examples described herein utilize p-type semiconductor wafers cut in the {100} plane. The wafer 305 shown in FIG. 3 is an example; the stress sensing elements and reference resistors described herein are not limited to a wafer with a [100] notch, a {100} plane, or p-type doping. In other examples, an n-type semiconductor substrate is used. The n-type semiconductor wafer can be cut in any appropriate plane, such as {100}.

Stress sensing element 300 includes a reference resistor 310 and a sensing resistor 320. In this example, reference resistor 310 and sensing resistor 320 are n-type resistors. In some examples, reference resistor 310 and sensing resistor 320 are p-type resistors. In other examples, reference resistor 310 and sensing resistor 320 utilize different doping types, such as mixed doping. Sensing resistor 320 includes a first resistor element 320A aligned in the y direction and a second resistor element 320B aligned in the x direction. The alignment of resistor elements 320A and 320B causes most current flow through resistor elements 320A and 320B to be either longitudinal or transverse to the [100] crystal axis. Current flows through resistor element 320A longitudinal to the crystal axis. Current flows through resistor element 320B transverse to the [100] crystal axis direction, in the [010] direction. In other examples, resistor elements 320A and 320B are aligned such that current flow through resistor elements 320A and 320B is either longitudinal or transverse to the [110] crystal axis. Other resistor orientations are possible as well. For example, resistor elements 320A and 320B can be rotated 45 degrees from alignment with the x and y axes. In another example, one of resistor elements 320A and 320B includes multiple lines of resistive elements, such that the ratio of resistor element 320A to resistor element 320B is not one to one. Reference resistor 310 is a vertical resistor aligned in the z direction.

Figure 4:
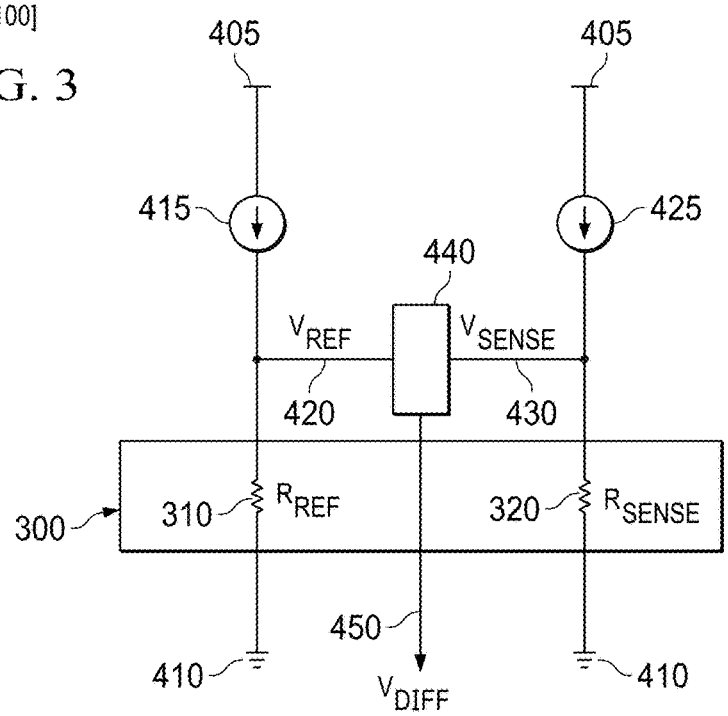
FIG. 4 illustrates an example stress sensing circuit including the stress sensing element shown in FIG. 3.

FIG. 4 illustrates an example stress sensing circuit 400 including the stress sensing element 300 shown in FIG. 3. Stress sensing circuit 400 also includes two current sources and a difference circuit. Current source 415 is coupled to a supply voltage node 405 and to reference resistor 310. In this example, reference resistor 310 is further coupled to common mode node 410. Current source 415 applies a current to reference resistor 310, causing a voltage drop across reference resistor 310. This voltage Vref 420 is provided to difference circuit 440 from a point between current source 415 and reference resistor 310. Current source 425 is coupled to a supply voltage node 405 and to sensing resistor 320. Sensing resistor 320 is further coupled to common mode node 410. Current source 425 applies a current to sensing resistor 320, causing a voltage drop across sensing resistor 320. This voltage Vsense 430 is provided to difference circuit 440 from a point between current source 425 and sensing resistor 320. In other examples, reference resistor 310 and sensing resistor 320 are coupled to a supply voltage at node 410. In this example, sensing resistor 320 includes both resistor element 320A and resistor element 320B coupled together in series. In other examples, a separate stress sensing circuit 400 is included for each of resistor element 320A and resistor element 320B.

Difference circuit 440 outputs a voltage difference signal Vdiff 450. In some examples, difference circuit 440 is an amplifier. Vdiff 450 represents the difference between Vsense 430 and Vref 420, and can be used to determine values for stress components in the transverse and longitudinal directions to the [100] crystal axis. In turn, the values for these stress components can be used to determine appropriate adjustments to operation in other circuits on the IC. To determine correct values for stress components in the transverse and longitudinal directions, reference resistor 310 is substantially independent from the direction of in-plane stresses. Further, reference resistor 310 and sensing resistor 320 have the same temperature coefficients.

For example, sensing resistor 320 and reference resistor 310 have expected resistance values and corresponding expected values for Vsense and Vref, and by extension an expected value of Vdiff. Because reference resistor 310 and sensing resistor have the same temperature coefficient, any difference between the actual and expected values for Vsense and Vref due to the temperature of the semiconductor die including stress sensing circuit 400 is cancelled out. Thus, a difference between the actual and expected values of Vdiff are likely due to in-plane stresses on the semiconductor die.

Reference resistor 310 is substantially independent from the direction of in-plane stresses, and so the difference between the actual and expected values of Vdiff are likely due to changes in Vsense from changes in the resistance of sensing resistor 320. The perpendicular arrangement of resistor element 320A and resistor element 320B allows the difference between the actual and expected Vdiff to be apportioned according to the direction and magnitude of in-plane stress components on the semiconductor die. The direction and magnitude of in-plane stress components can be provided to other circuits on the semiconductor die, and used to determine appropriate calibration parameters for devices on the die.

Figure 5A:
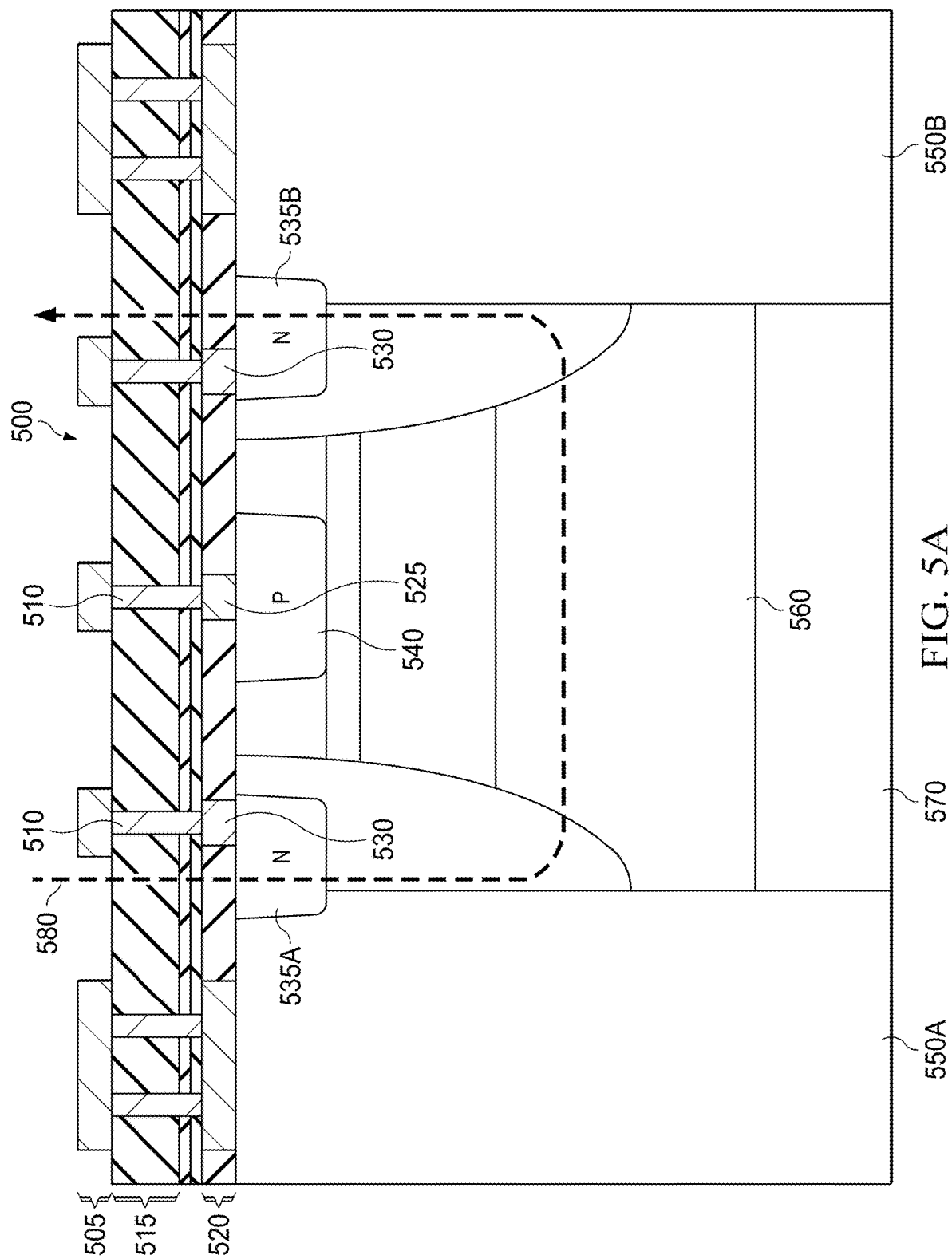
FIGS. 5A-B illustrate an example reference resistor for use in a stress sensing element.
Figure 5B:
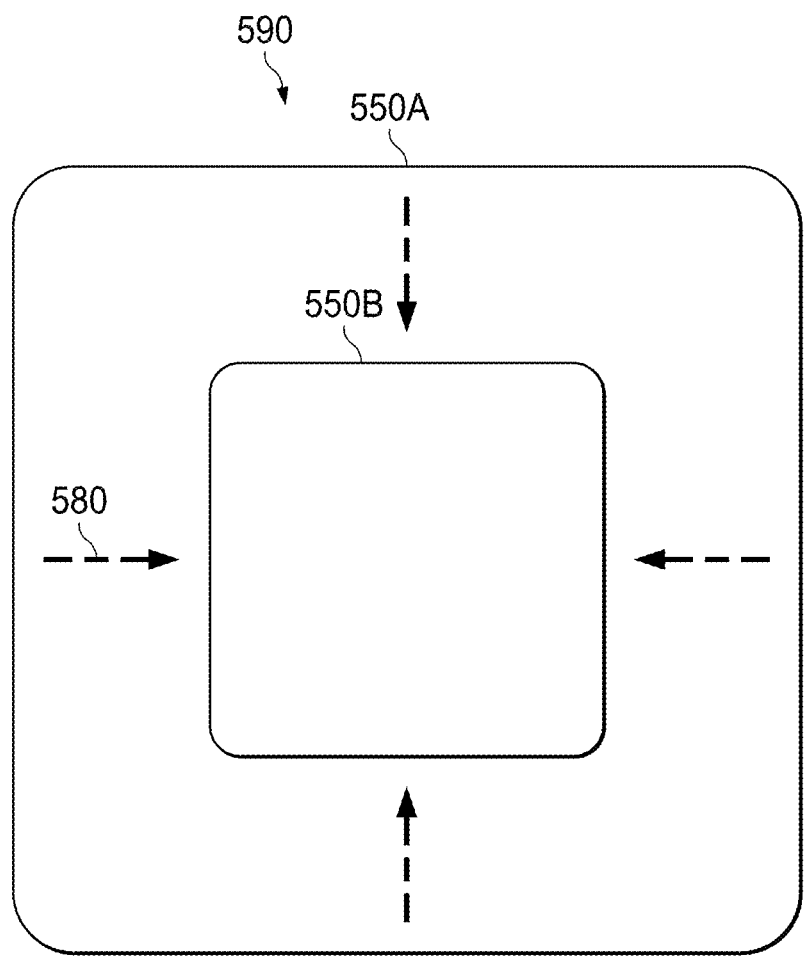
Figure 5B:
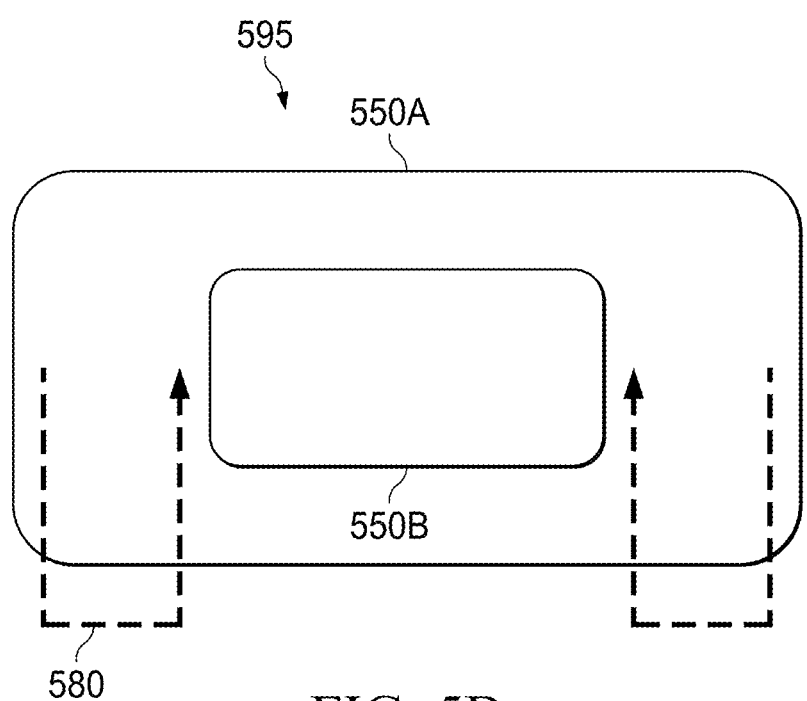

FIGS. 5A-B illustrate an example reference resistor 500 for use in a stress sensing element (e.g., to implement reference resistor 310). Reference resistor 500 is an n-type, vertical resistor. In other examples, reference resistor 500 is a p-type resistor. FIG. 5A illustrates a cross section of reference resistor 500. A deep n-well 560 is implanted into p-type substrate 570, which can include an epitaxial layer (not specifically shown). In other examples, substrate 570 is an n-type substrate. Deep n-well 560 forms a buried layer and is highly doped to promote current flow and exhibit low resistance. Trenches 550 are side wall doped deep trenches contacting opposite ends of deep n-well 560, and are highly doped for horizontal current flow and lower doped for vertical current flow. This causes trenches 550 to have a first piezo-resistive coefficient for current flow in lateral directions and a second, higher piezo-resistive coefficient for current flow in vertical directions. Moreover, a greater portion of the resistive path is in the vertical direction, along trenches 550, while a smaller portion of the resistive path is in the lateral direction.

N-wells 535 are implanted into the surface of substrate 570 to contact trenches 550, followed by the implantation of p-well 540. Dielectric layer 520 is then formed to cover the surface of substrate 570. N contacts 530 are implanted in n-wells 535, and p contact 525 is implanted in p-well 540. Inter-level dielectric 515 is deposited before vias 510 are formed to n contacts 530 and p contact 525. Then metallization layer 505 is formed over vias 510.

Current 580 flows from n-well 535A, through trench 550A to deep n-well 560. Current 580 flows the length of deep n-well 560 to trench 550B, up trench 550B and through n-well 535B. The depth and lower doping concentration of trenches 550 for current flow in the vertical direction causes reference resistor 500 to exhibit higher vertical resistance and larger voltage differences across trenches 550. In contrast, the thickness and higher doping concentration of deep n-well 560 results in a lower resistive path for current flow in the lateral directions, causing reference resistor 500 to exhibit lower lateral resistance and a smaller voltage difference across deep n-well 560.

Although described as "trenches" in FIG. 5A, any appropriate deep vertical path can be used. The disclosed reference resistors include two deep vertical paths with a lower doping concentration for current flow in the vertical direction, which cause the disclosed reference resistors to exhibit higher vertical resistance and larger voltage differences across the deep vertical paths. The two deep vertical paths are coupled together by a deep well with a higher doping concentration for current flow in the lateral directions, which cause the disclosed reference resistors to exhibit lower lateral resistance and a smaller voltage difference across the deep well. The primarily vertical current flow causes the disclosed reference resistors to be largely independent of the direction of in-plane stresses.

FIG. 5B illustrates a top down view 590 and an angled view 595 of a cross section of trenches 550 of reference resistor 500. The cross-section of trenches 550 is symmetric in the x and y directions, in this example a square shape. In other examples, the inner trenches 550B are in a pinhole or other symmetric shape. Trenches 550 and deep n-well 560 are two-fold rotationally symmetric around the z-axis of the reference resistor 500, but not symmetric when rotated in the z direction. The x and y symmetric cross-section of trenches 550 and the primarily vertical current flow through reference resistor 500 reduces stress direction dependencies such that reference resistor 500 is largely independent from the direction of in-plane stress on the IC. Reference resistor 500 is primarily resistant in the vertical direction. The doping in trenches 550 is the same as doping within an associated sensing resistor, such that the reference resistor 500 and the associated sensing resistor have the same temperature coefficient. It will be understood that the drawings of resistor 500 are not necessarily drawn to scale.

Figure 6:
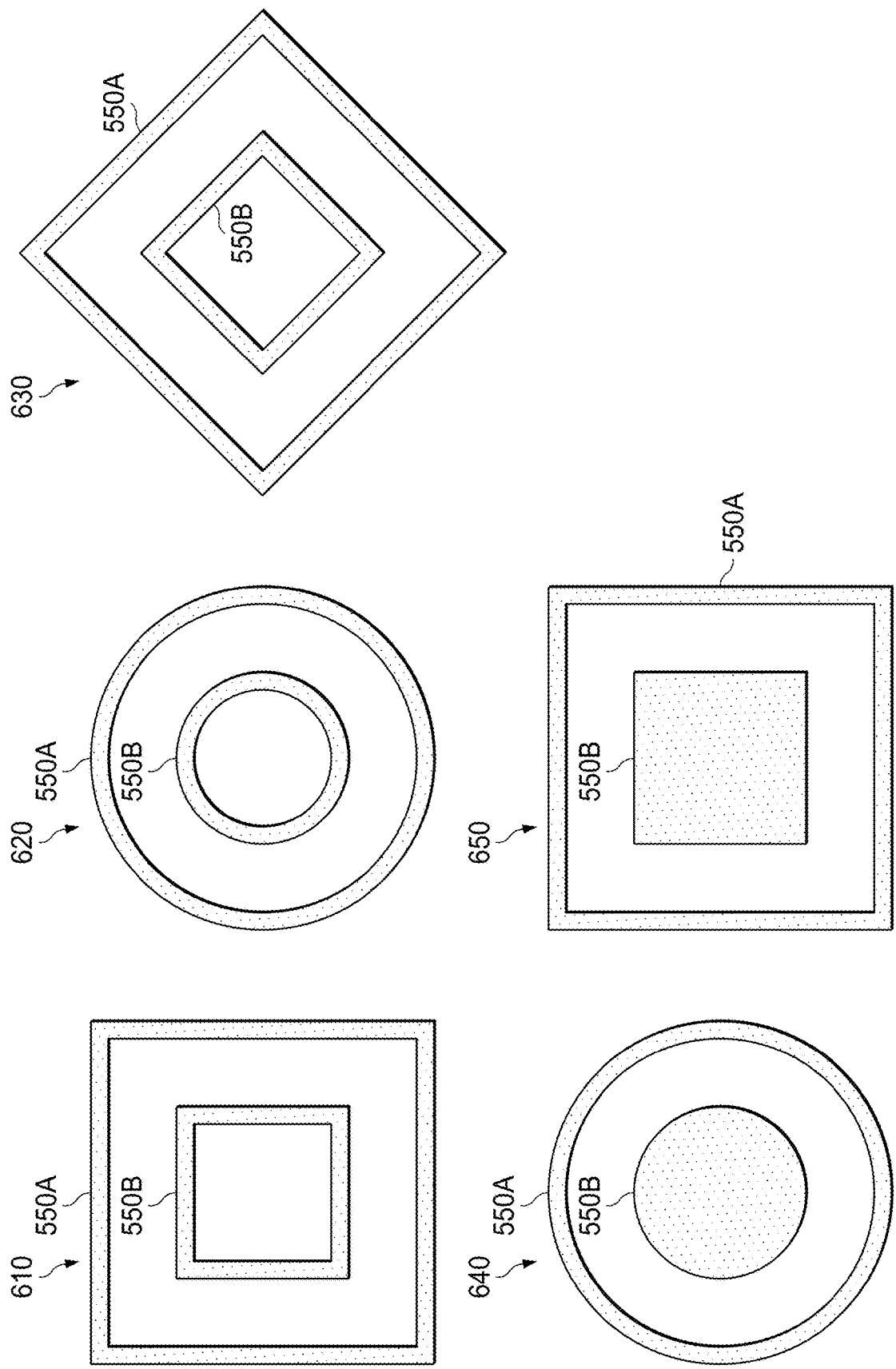
FIG. 6 illustrates example layouts of trenches in the example reference resistor shown in FIGS. 5A-B.

FIG. 6 illustrates alternative cross-sections of trenches 550 of reference resistor 500. Example layout 610 shows trench 550A in a square shape and trench 550B in a smaller square shape inside the square formed by trench 550A. Example layout 620 shows trench 550A in a circular shape and trench 550B in a smaller circular shape inside the circle formed by trench 550A. Example layout 630 shows trench 550A in a square shape rotated 45 degrees from the x and y axes and trench 550B in a smaller square shape rotated 45 degrees from the x and y axes inside the rotated square formed by trench 550A. Example layout 640 shows trench 550A in a circular shape and trench 550B in a circular pinhole shape inside the circle formed by trench 550A. Example layout 650 shows trench 550A in a square shape and trench 550B in a square pinhole shape inside the square formed by trench 550A. In each of example layouts 610, 620, 630, 640, and 650, trenches 550 are symmetric and experience substantially the same amount of stress in the x direction as in the y direction. The example layouts shown in FIG. 6 are not the complete set of possible layouts for trenches 550. Other symmetric layouts can be used as well.

The examples described herein utilize p-type semiconductor wafers cut in the {100} plane. However, the reference resistors described herein are not limited to a wafer with a [100] notch, a {100} plane, or p-type doping. In other examples, an n-type semiconductor substrate is used. The n-type semiconductor wafer can be cut in any appropriate plane, such as {100}.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors. Unless otherwise stated, in this description, "the same" or "substantially" or "largely" the same means the two are within ten percent of each other, "substantially" or "largely" unaffected means less than a ten percent change, and "substantially" all means ninety percent or more.

Modifications are possible in the described embodiments, and other embodiments are possible, within the scope of the claims.

What is claimed is:

1. An integrated circuit (IC), comprising:
 a semiconductor substrate having a surface; and
 a reference resistor, including:
  a first region of a first conductivity type formed in the substrate, wherein the first region extends in a lateral direction parallel to the surface;
  a second region of a second conductivity type formed in the substrate and coupled to the first region, wherein the second region extends in a vertical direction perpendicular to the surface, and wherein the second conductivity type is configured to impede current flow in the vertical direction;

a third region of the second conductivity type formed in the substrate and coupled to the first region, wherein the third region extends in the vertical direction;

a first contact structure coupled to the second region and the surface; and a second contact structure coupled to the third region and the surface, wherein the reference resistor is two-fold rotationally symmetric around the vertical direction.

2. The IC of claim 1, wherein an inner side of the second region and the first contact structure is separated from an outer side of the third region and the second contact structure by an isolating structure.

3. The IC of claim 1, wherein a cross-section of the third region and the second contact structure is pin-hole shaped.

4. The IC of claim 1, wherein the second conductivity type is n-doped.

5. The IC of claim 1, wherein the IC includes a second resistor, and wherein the second conductivity type has a same temperature coefficient as a conductivity type of the second resistor.

6. The IC of claim 5, wherein the conductivity type of the second resistor is the second conductivity type.

7. The IC of claim 1, wherein the semiconductor substrate is a p-type silicon substrate.

8. An integrated circuit (IC), comprising:
a semiconductor substrate having a surface;
a lateral resistor arranged in a first plane parallel to the surface; and
a vertical reference resistor, comprising:
a layer arranged in a second plane parallel to the surface and deeper than the first plane, the layer having a doping configured to promote current flow in the second plane, and
a first trench and a second trench coupled between the layer and the surface and arranged in a vertical direction orthogonal to the first and the second planes, the first and the second trenches having a doping configured to impede current flow in the vertical direction, wherein a cross-section of the first and the second trenches is two-fold rotationally symmetric around the vertical direction, and wherein the first and the second trenches and the lateral resistor have a same temperature coefficient.

9. The IC of claim 8, wherein an inner side of the first trench is separated from an outer side of the second trench by an isolating structure.

10. The IC of claim 8, wherein a cross-section of the second trench is pin-hole shaped.

11. The IC of claim 8, wherein the first and the second trenches are sidewall doped.

12. The IC of claim 8, wherein the first and the second trenches are n-doped.

13. The IC of claim 8, wherein a cross-section of the lateral resistor is L-shaped, the lateral resistor including:
a first element; and
a second element coupled in series with the first element, wherein the second element is configured such that current flows through the second element in a direction orthogonal to a direction of current flow through the first element.

14. The IC of claim 8, wherein the semiconductor substrate is a p-type silicon substrate.

15. The IC of claim 8, further comprising:
a first current source coupled to the lateral resistor;
a second current source coupled to the vertical reference resistor; and
an amplifier coupled to the lateral resistor and to the vertical reference resistor, the amplifier having an output to provide a voltage difference signal.

16. The IC of claim 15, wherein the voltage difference signal indicates an in-plane stress on the IC.

* * * * *